United States Patent
Macfarlane et al.

(10) Patent No.: US 11,848,472 B2
(45) Date of Patent: Dec. 19, 2023

(54) DIFFERENTIAL CIRCULATOR

(71) Applicant: SKYWORKS SOLUTIONS, INC., Irvine, CA (US)

(72) Inventors: Iain Alexander Macfarlane, Insch (GB); Patrick Marcus Naraine, Irvine, CA (US); Scott David Wilson, Cork (IE)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 17/886,719

(22) Filed: Aug. 12, 2022

(65) Prior Publication Data

US 2023/0057627 A1 Feb. 23, 2023

Related U.S. Application Data

(60) Provisional application No. 63/233,975, filed on Aug. 17, 2021.

(51) Int. Cl.
*H01P 1/387* (2006.01)
*G01R 33/032* (2006.01)

(52) U.S. Cl.
CPC ............ *H01P 1/387* (2013.01); *G01R 33/032* (2013.01)

(58) Field of Classification Search
CPC .. H01P 1/387; H01P 1/38; H01P 1/383; H01P 1/32; H01P 1/36; H01P 1/362; H01P 1/365; H01P 1/37; H01P 1/375; H01P 1/393; H01P 1/397; H01P 1/215; H01P 1/217; H01P 1/218; G01R 33/032

USPC .................................................. 333/1.1, 24.2
See application file for complete search history.

(56) References Cited

U.S. PATENT DOCUMENTS

| | | |
|---|---|---|
| 6,529,103 B1 | 3/2003 | Brendel et al. |
| 2006/0139118 A1 | 6/2006 | Vaughn et al. |
| 2011/0068877 A1* | 3/2011 | Chawla .................... H01P 1/387 333/1.1 |
| 2015/0364809 A1 | 12/2015 | Carr et al. |
| 2017/0104256 A1 | 4/2017 | Bedinger et al. |
| 2017/0133735 A1* | 5/2017 | Volobouev ............... H01P 5/028 |
| 2018/0166763 A1 | 6/2018 | Cruickshank et al. |
| 2020/0295425 A1* | 9/2020 | Ohata ...................... H01P 1/387 |
| 2022/0181760 A1 | 6/2022 | Macfarlane et al. |
| 2022/0231393 A1 | 7/2022 | Musgrove et al. |

FOREIGN PATENT DOCUMENTS

EP 3261170 A1 12/2017

* cited by examiner

*Primary Examiner* — Stephen E. Jones
(74) *Attorney, Agent, or Firm* — Lando & Anastasi, LLP

(57) ABSTRACT

A differential circulator comprises first and second magnets, a ground plane, a first three-port junction conductor disposed between the first magnet and the ground plane, and a second three-port junction conductor disposed between the second magnet and the ground plane. The first three-port junction conductor and the second three-port junction conductor are in the same magnetic circuit including the first and second magnets to provide substantially same pass characteristics to radio frequency signals passing through the first three-port junction conductor and the second three-port junction conductor.

21 Claims, 18 Drawing Sheets

DIFFERENTIAL CIRCULATOR

CROSS-REFERENCE TO RELATED APPLICATIONS

This application claims priority under 35 U.S.C. § 119(e) to U.S. Provisional Patent Application Ser. No. 63/233,975, titled DIFFERENTIAL CIRCULATOR," filed Aug. 17, 2021, the entire content of which is incorporated herein by reference for all purposes.

BACKGROUND

1. Field of Invention

Aspects and embodiments disclosed herein relate to differential circulators and isolators useful for radio frequency systems and devices utilizing differential antennae.

2. Discussion of Related Art

Circulators are passive electronic devices that are used in high-frequency (e.g., microwave) radio frequency systems to permit a signal to pass in one direction while providing high isolation to reflected energy in the reverse direction. Circulators commonly include a disc-shaped assembly comprising a disc-shaped ferrite or other ferromagnetic ceramic element, disposed concentrically within an annular dielectric element. Ferrite materials (spinel, hexagonal or garnet) have suitable low-loss microwave characteristics. The annular dielectric element is commonly made of ceramic material.

SUMMARY

In accordance with one aspect, there is provided a differential circulator. The differential circulator comprises first and second magnets, a ground plane, a first three-port junction conductor disposed between the first magnet and the ground plane, and a second three-port junction conductor disposed between the second magnet and the ground plane. The first three-port junction conductor and the second three-port junction conductor are in a same magnetic circuit including the first and second magnets to provide substantially same pass characteristics to radio frequency signals passing through the first three-port junction conductor and the second three-port junction conductor.

In some embodiments, the first three-port junction conductor is formed of a same material as the second three-port junction conductor.

In some embodiments, the first three-port junction conductor has same dimensions as the second three-port junction conductor.

In some embodiments, the differential circulator further comprises a first dielectric spacer disposed between the first three-port junction conductor and the ground plane.

In some embodiments, the differential circulator further comprises a second dielectric spacer disposed between the second three-port junction conductor and the ground plane.

In some embodiments, the differential circulator further includes a housing in which the first and second magnets, the ground plane, and the first and second three-port junction conductors are disposed and a frame disposed in the housing, the frame supporting conductive posts electrically coupled to ports of each of the first and second three-port junction conductors.

In some embodiments, the frame includes insulating blocks in which the conductive posts are secured.

In some embodiments, the conductive posts extend to and terminate at a plane below a bottom of the housing.

In some embodiments, the differential circulator is configured as a surface mount component.

In some embodiments, the first three-port junction conductor and the second three-port junction conductor are substantially matched with respect to return loss within an operating frequency band.

In some embodiments, the first three-port junction conductor and the second three-port junction conductor are substantially matched with respect to insertion loss within an operating frequency band.

In some embodiments, the first three-port junction conductor and the second three-port junction conductor are substantially matched with respect to isolation within an operating frequency band.

In some embodiments, the differential circulator exhibits a cross-junction isolation of better than −35 dB within an operating frequency band In some embodiments, the first three-port junction conductor and the second three-port junction conductor are substantially matched with respect to insertion phase within an operating frequency band.

In accordance with another aspect, there is provided a differential transceiver. The differential transceiver comprises a differential transmission circuit, a differential power amplifier in first and second signal paths from the differential transmission circuit, first and second dipole antennas, and a differential circulator including a first three-port junction conductor in the first signal path between the differential power amplifier and a pole of the first dipole antenna and a second three-port junction conductor in the second signal path between the differential power amplifier and a pole of the second dipole antenna.

In some embodiments, the differential circulator includes first and second magnets and the first three-port junction conductor and the second three-port junction conductor are in a same magnetic circuit including the first and second magnets.

In some embodiments, the differential transceiver further comprises a differential receive circuit, wherein the first three-port junction conductor of the differential circulator is in a third signal path between the pole of the first dipole antenna and the differential receive circuit and the second three-port junction conductor of the differential circulator is in a fourth signal path between the pole of the second dipole antenna and the differential receive circuit.

In some embodiments, the differential transceiver further comprises a differential low noise amplifier in the third and fourth signal paths between the first and second three-port junction conductors of the differential circulator and the differential receive circuit.

In some embodiments, the differential transceiver is included in a radio frequency module.

In some embodiments, the radio frequency module is included in a radio frequency device.

In some embodiments, the radio frequency device is configured to operate as a 5G system.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation and are not intended as a definition of the limits of the invention. In the drawings.

DETAILED DESCRIPTION

Figure 1A:
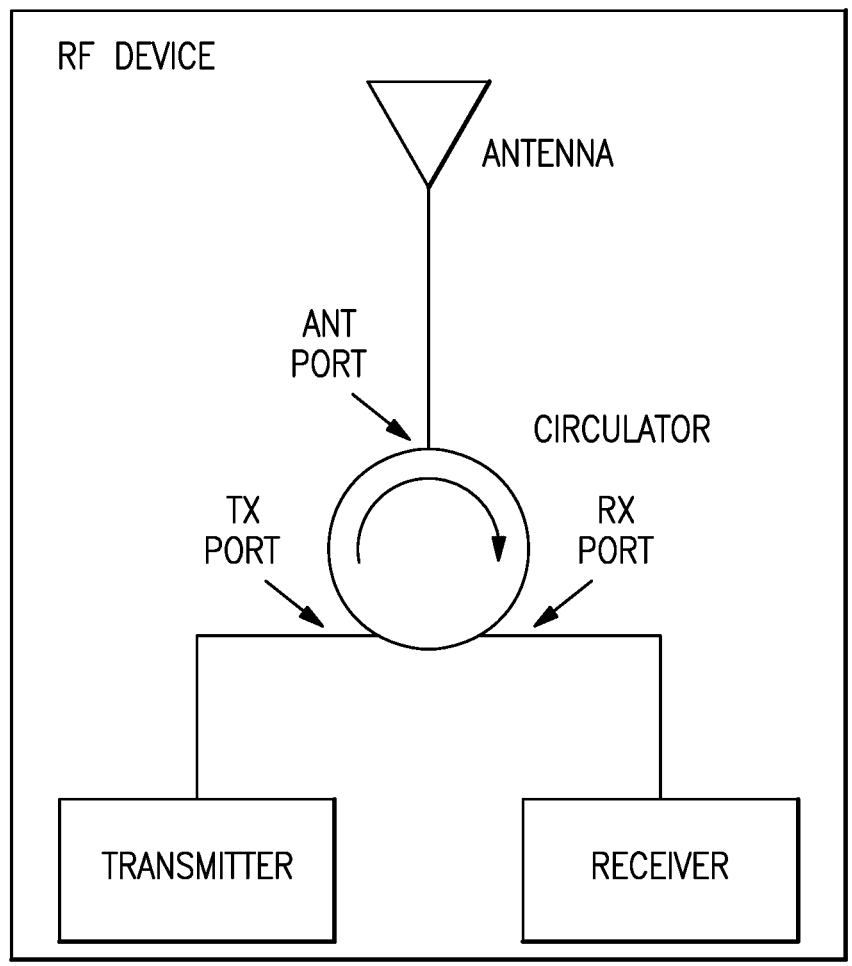
FIG. 1A is a schematic view of a radio circuit including aa circulator.

Conventional circulators are passive devices including three ports that may be used to connect a radio frequency (RF) transmitter and a RF receiver in a RF device to the same antenna. As illustrated in FIG. 1A, a circulator may include three ports, a TX port connected to a RF transmitter, a RX port connected to a RF receiver and an ANT port connected to an antenna. The circulator routes signals from the transmitter to the antenna while preventing signals from the transmitter from reaching the receiver, or at least substantially attenuating signals travelling from the transmitter to the receiver. The circulator routes signals from the antenna to the receiver while preventing signals from the antenna from reaching the transmitter, or at least substantially attenuating signals travelling from the antenna to the transmitter. The circulator thus allows both the receiver and transmitter to utilize the same antenna without interfering with one another and without the need for antenna switch to alternatively couple the antenna to the receiver or transmitter (although an antenna switch may be included in some RF circuits for even greater receiver/transmitter isolation).

Figure 1B:
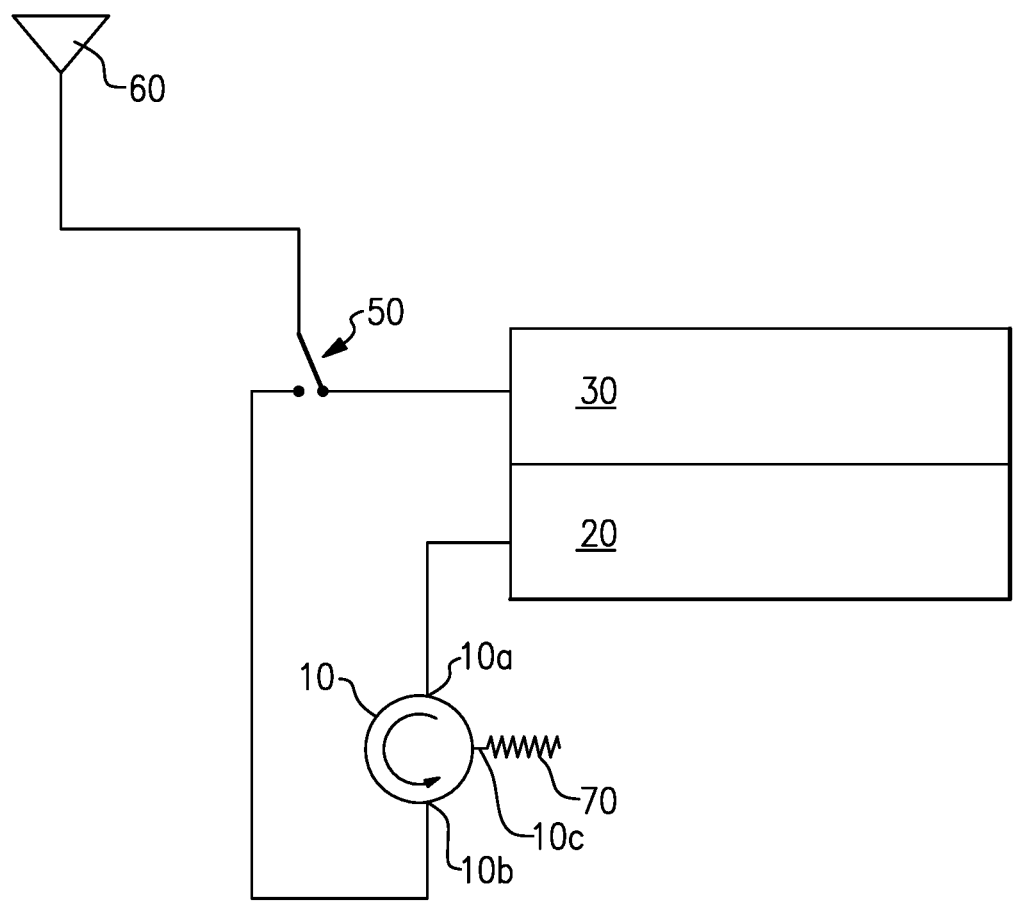
FIG. 1B is a schematic view of another radio circuit including a circulator.

In other RF circuits, one of the ports of the circulator is coupled to ground, and the circulator is used as an isolator. One example of such a radio transceiver configured for duplex operation is illustrated in FIG. 1B. The radio transceiver configured for duplex operation includes a transmitter 20, a receiver 30, and a switch 50. Isolator 10 is typically a one-way device which may facilitate reduction in the amplitude of reflected power or of extraneous signals that might be captured by antenna 60 and travel toward the transmitter 20. In the illustrated example, isolator 10 comprises a circulator including a load 70 coupled to the port 10c. Isolator 10 is typically configured such that signals from transmitter 20 entering input port 10a mostly exit output port 10b and proceed to antenna 60, and signals entering output port 10b from the antenna 60 mostly exit load port 10c and are dissipated in load 70 as heat. Signal propagation from port 10b to port 10a and from port 10a to port 10c is highly attenuated. The use of isolator 10 reduces the likelihood of undesirable mixing of signals inside the transmitter 20 or receiver 30 which could generate interference.

The combination of a circulator and a load coupled to one port becomes a device such as isolator 10 that may conduct RF power in a forward direction from a transmitter 20 output to an antenna 60 with a low loss of power due to attenuation. Any RF signal that may be reflected from the antenna 60 due to impedance mismatch or de-tuning, or coupled into the antenna 60 from an adjacent transmitting antenna will be presented with a high loss path toward the transmitter 20 and a low loss path toward the load 70. Reflected power is thus prevented from reaching the transmitter 20 where it might impair the performance of the transmitter's amplifier stage. In the case of a coupled signal, mixing in the transmitter's preamplifier stage is controlled to reduce or eliminate signals known as intermodulation.

Figure 2:
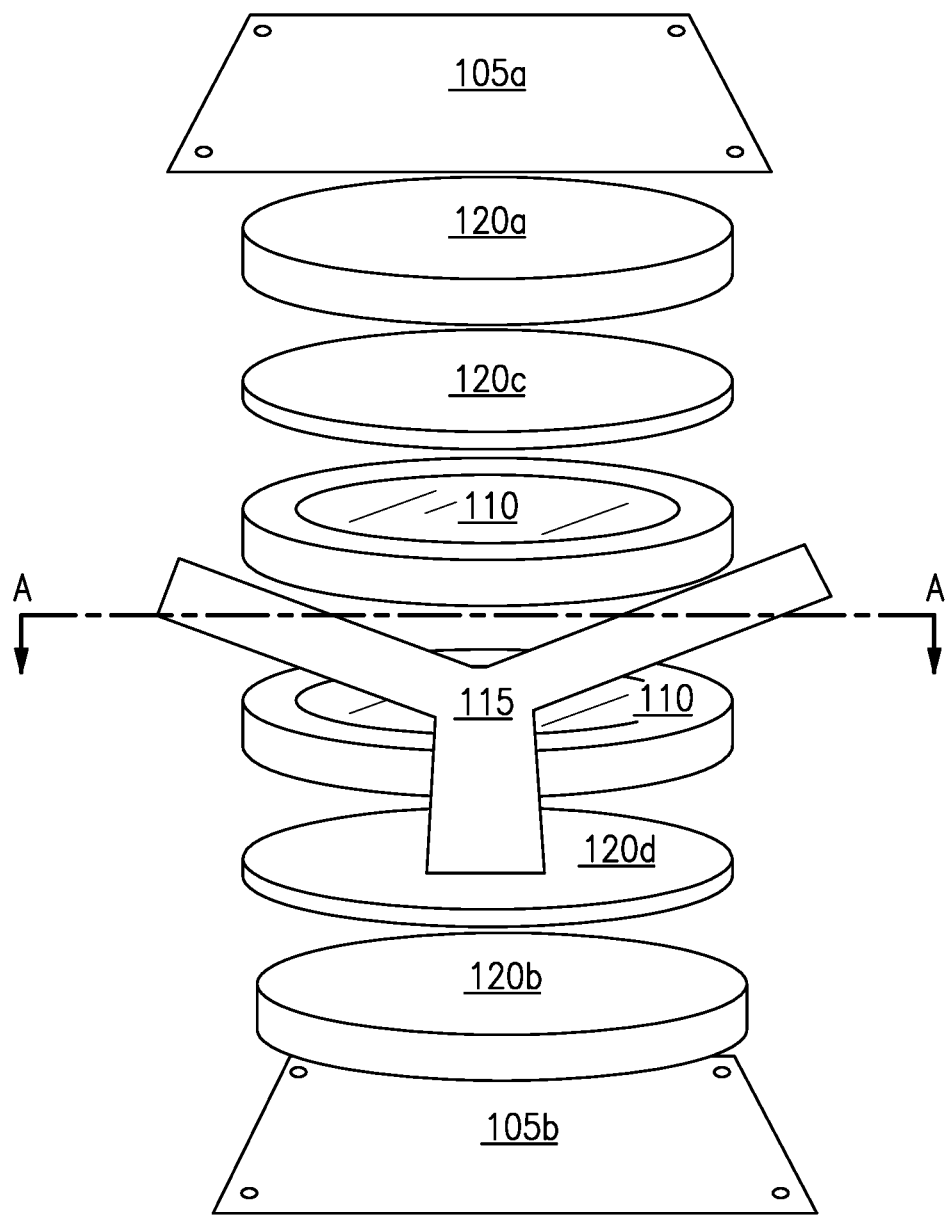
FIG. 2 is a partial exploded view of a circulator.

FIG. 2 is an exploded view of a circulator such as might be used in an RF circuit such as illustrated in FIG. 1A or 1B. The circulator includes upper and lower pole pieces/casing elements 105a and 105b, between which are stacked an upper magnet 120a, a lower magnet 120b, an upper magnet ground plate 120c, a lower magnet ground plate 120d, upper and lower magnetic-dielectric disc assemblies 110, each including a disc of ceramic ferrite, for example, yttrium-iron-garnet (YIG), or any other suitable ferrimagnetic garnet or spinel, disposed within a ring of a dielectric ceramic material, for example, alumina or a material having the composition MgO—CaO—ZnO—$Al_2O_3$—$TiO_2$, and a "Y" junction center conductor 15 (also referred to as a three-port junction conductor herein).

Figure 3:
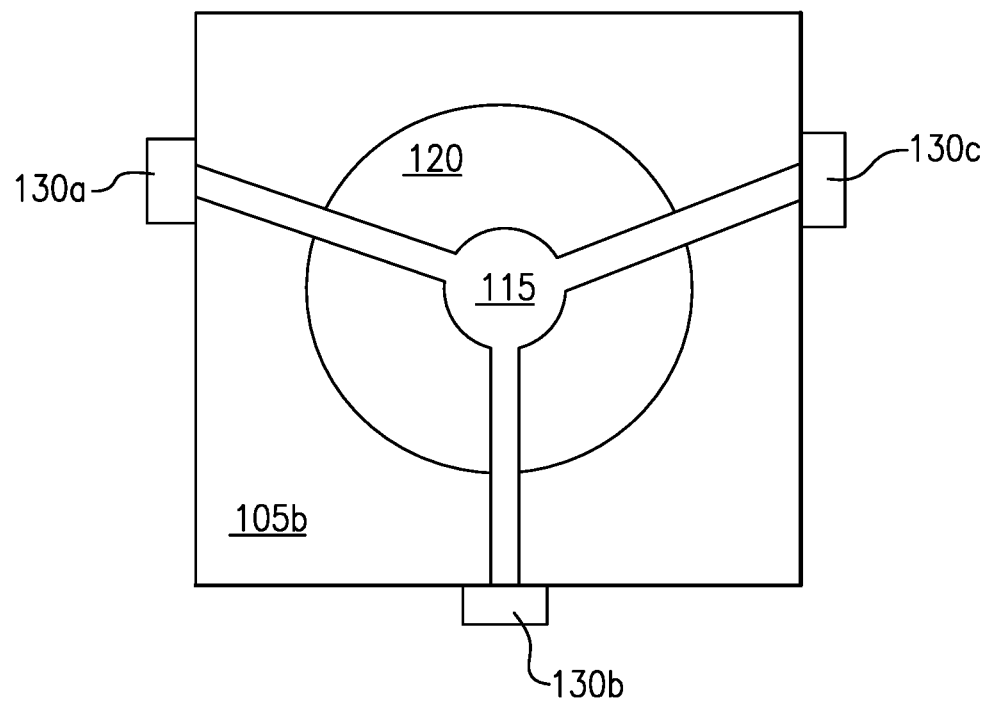
FIG. 3 is a cut away plan view of a circulator similar to that of FIG. 2 along line A-A.

FIG. 3 is a plan view of the circulator of FIG. 2 viewed cut away through line A-A of FIG. 2. For simplicity, elements 120b, 120d, and lower magnetic-dielectric disc assembly 110 are represented collectively by disc 120. Another possible configuration of "Y" junction center conductor 115 is shown connected to three ports 130a, 130b, and 130c that may correspond to the TX port, RX port, and ANT port of the circuit of FIG. 1A or ports 10a, 10b, and 10c of the circuit of FIG. 1B.

Figure 4:
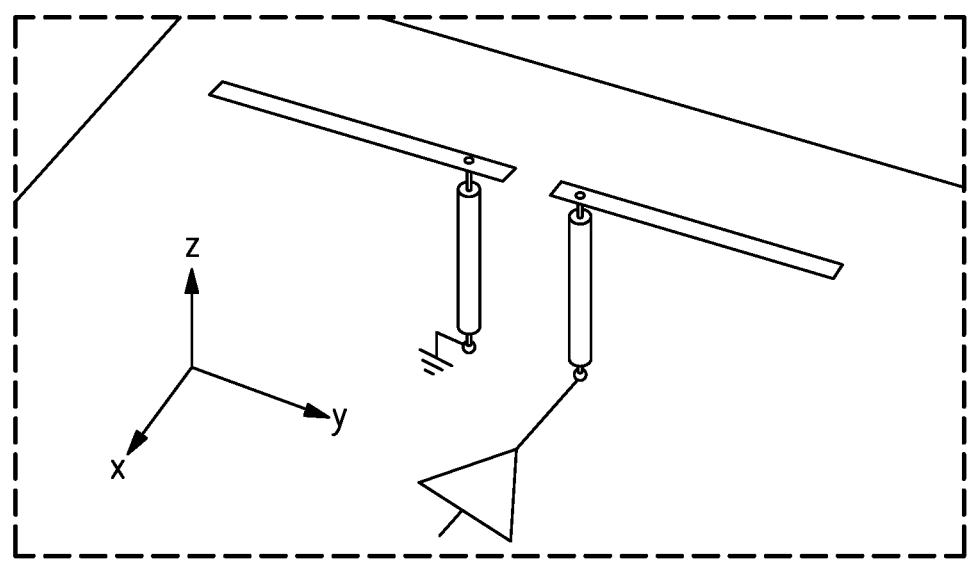
FIG. 4 illustrates an example of a dipole antenna.

Recently, to improve sensitivity and other operational parameters such as signal to noise ratio or directionality, RF devices are being formed with arrays of dipole antennas. An example of one dipole antenna is illustrated in FIG. 4. Typically, the dipole antenna sits up above a circuit board which provides a ground plane. The dipole antenna is driven on one side, while other side is grounded. The two dipoles of the dipole antenna are impedance balanced and would be driven by an impedance balanced power amplifier or amplifiers. The primary radiation direction is in z direction. Some RF devices may include up to 64 or more dipole antennas in an antenna array.

Using existing circulator technology, a differential transmission signal from a balanced amplifier is transformed to single-ended before a circulator and, if required, transformed back to a differential signal before an antenna. This technology utilizes two circulators.

Aspects and embodiments disclosed herein include a circulator which includes two junction conductors in one package. Although the junction conductors operate independently, they are both biased by the same magnetic circuit, so there are minimal additional parts compared to a standard single junction conductor circulator. One junction conductor operates on the +ve signal and the other on the −ve signal of a differential transmission or receive signal.

Advantages of the aspects and embodiments disclosed herein include, among others, reduced part count for a radio frequency system or device. Aspects and embodiments disclosed herein may remove the need for balun transformers in a radio frequency system or device operating with differential signals and device architectures and reduces the circulator quantity from two to one per branch.

Figure 5:
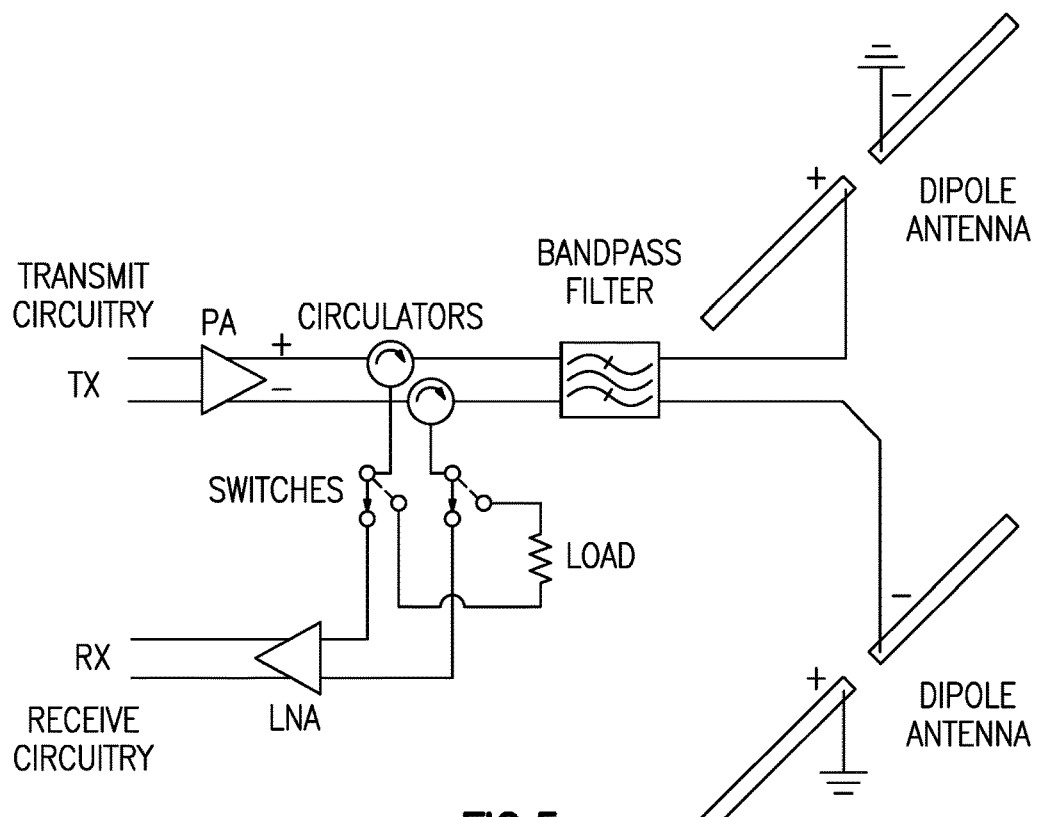
FIG. 5 is a high-level circuit diagram of an example of a differential transceiver.

As discussed above, when a transmission system uses a balanced amplifier and balanced antenna the differential signals may be transformed to single-ended before the circulator and then recombined into a differential signal before the antenna. In addition to the two transformation steps, two individual circulators are utilized, one for each single-ended signal. A transceiver circuit including a pair of circulators for driving two dipoles of a pair of dipole antennas is illustrated in FIG. 5. The transceiver of FIG. 5 includes a differential transmit circuit, a differential receive circuit, a differential low noise amplifier (LNA) in the receive signal path, a differential power amplifier (PA) in the transmit signal path, and a bandpass filter in the signal paths to and from the antennas. The transceiver of FIG. 5 further includes a pair of switches and a load element (resistor). The switches and load provide further receiver protection. While the transceiver is in the transmit time slot the switch connects the circulator port 3 to the load to further isolate the receiver from the transmitter, when the transceiver is in the receive timeslot the switch connects the circulator port 3 to the receiver to complete the receive circuitry.

The use of two different circulators in the transceiver of FIG. 5 may not be ideal. The differential signals provided to the two antennas by the transmit circuitry or the differential signals received by the receive circuitry from the dipole antennas are preferably matched as closely as possible in signal phase and amplitude. Due to inherent variabilities in the manufacturing process for circulators and differences in material properties, for example, magnetic field strength and uniformity in the magnets used in different circulators, it is difficult to produce circulators that are as well matched in operating parameters such as insertion loss, return loss, isolation, complex impedance, etc. as might be desired. The use of two different circulators in a differential transceiver such as illustrated in FIG. 5 might thus limit the operating parameters, for example, sensitivity and/or signal to noise ratio of the transmit and/or receive functions of the transceiver.

Figure 6:
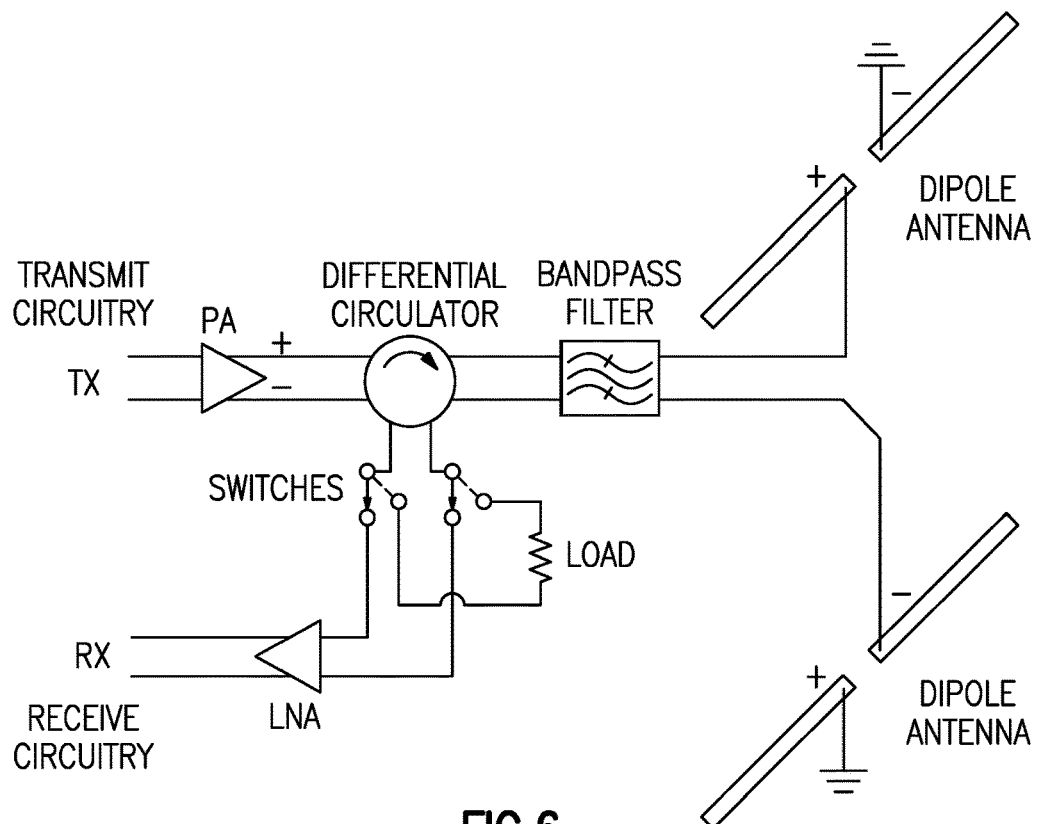
FIG. 6 is a high-level circuit diagram of another example of a differential transceiver.

To address the limitations of utilizing two possibly unmatched or poorly matched circulators in a differential transceiver such as illustrated in FIG. 5 one may instead use a single differential circulator as illustrated in the transceiver circuit of FIG. 6. As described in further detail below, a differential circulator essentially combines the two single-ended circulators in the transceiver of FIG. 5 into a single differential circulator. The differential circulator includes two "Y" junction conductors (also referred to as three-port junction conductors or simply "circuits" herein), for a total of six ports, in the same magnetic field circuit. The two three-port junction conductors may be made of the same material(s) and have the same dimensions or substantially the same dimensions. Application of the same magnetic field to the two different "Y" junction conductors provides for the two different "Y" junction conductors to be well matched in operating parameters such as insertion loss, insertion phase, return loss, isolation, complex impedance, etc. A first differential signal passing through a first of the "Y" junction conductors would exhibit attenuation and phase shift that is well matched to that of a second complimentary differential signal passing through the second of the "Y" junction conductors of the differential circulator.

Figure 7A:
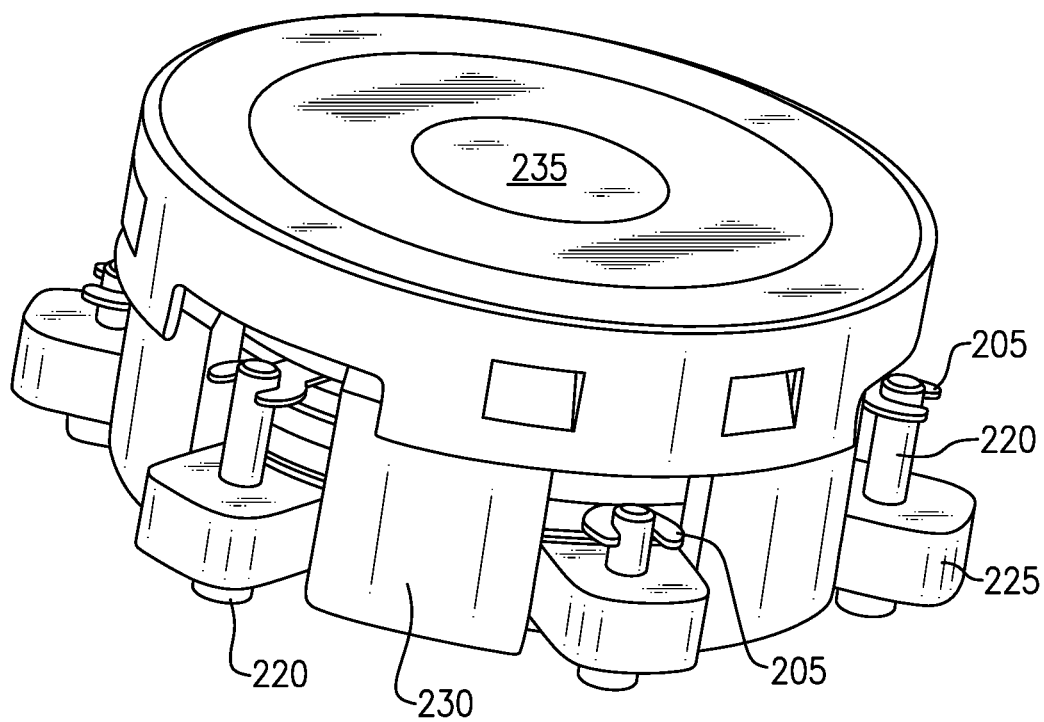
FIG. 7A is an isometric view from the top of an example of a differential circulator.
Figure 7B:
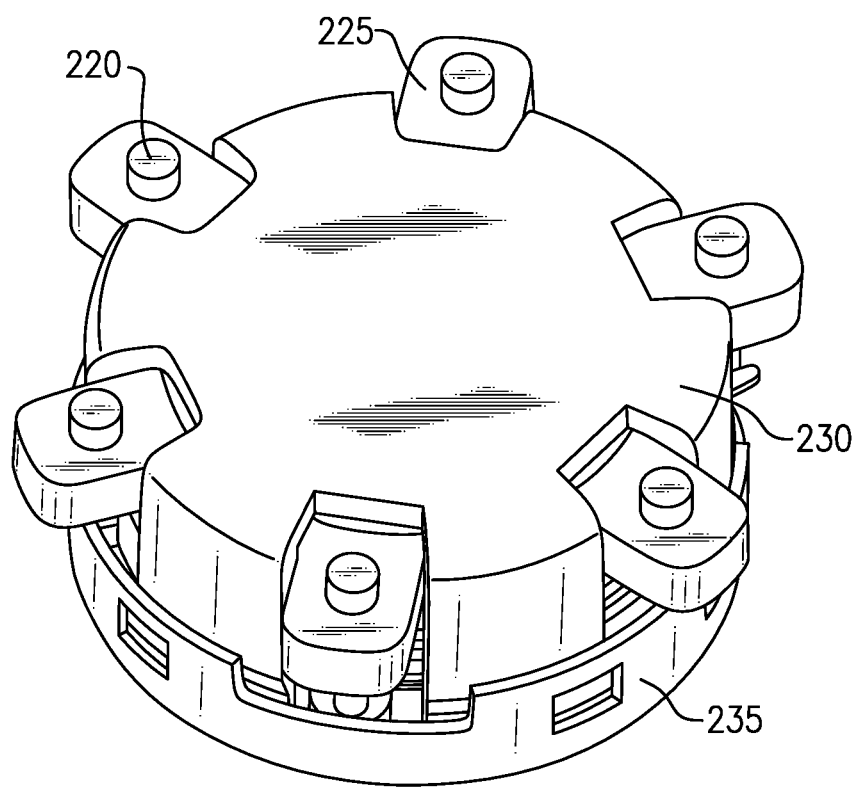
FIG. 7B is a plan view from the bottom of an example of a differential circulator.
Figure 8:
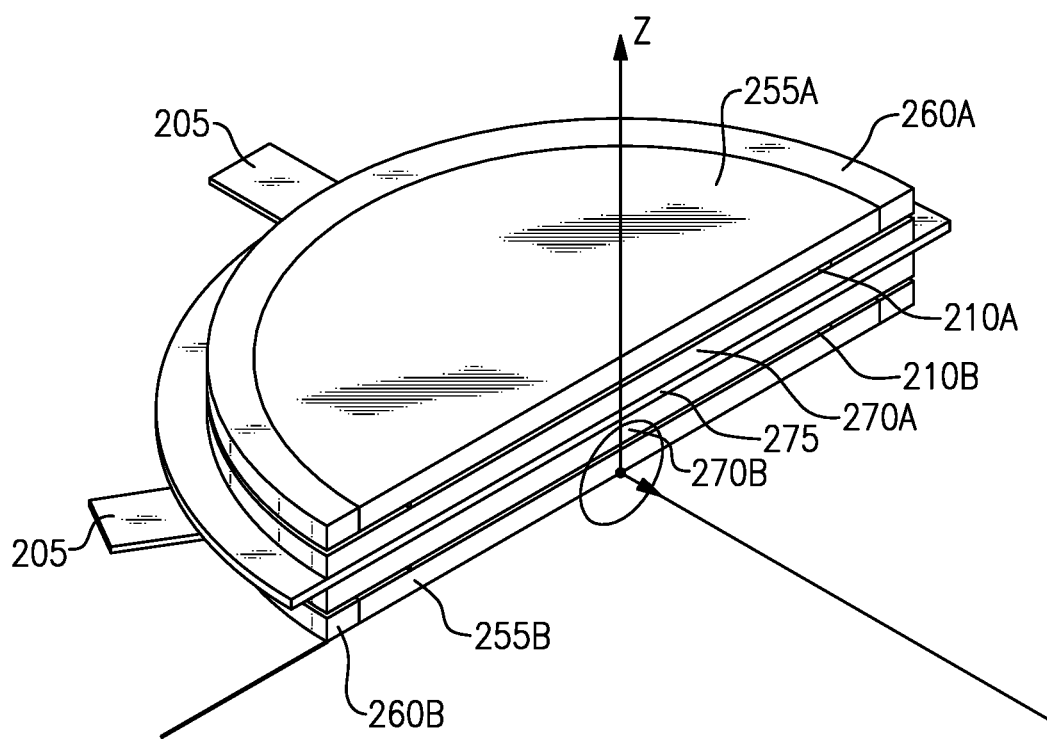
FIG. 8 is a partial cross-sectional view of an example of a differential circulator.
Figure 9:
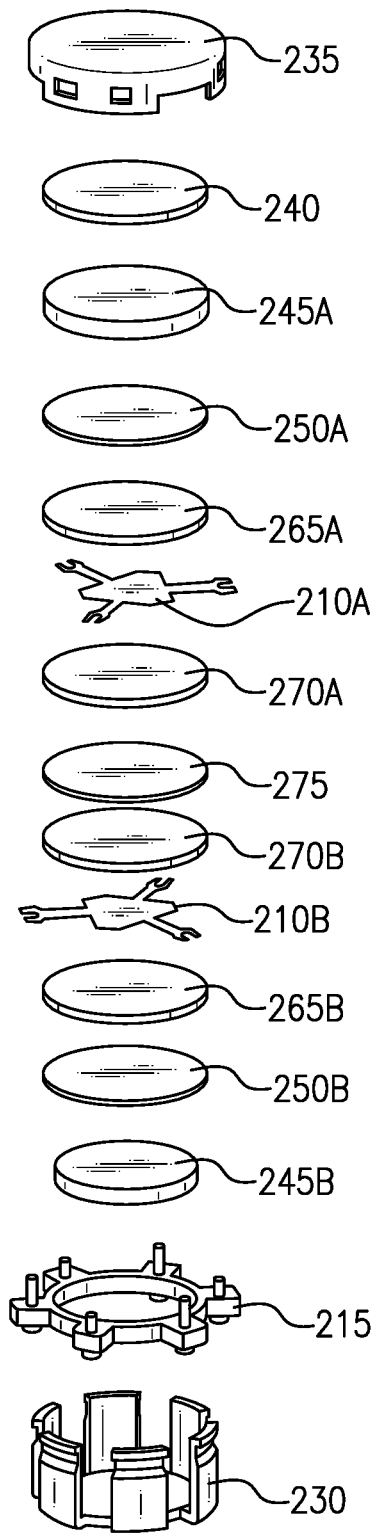
FIG. 9 is an exploded view of an example of a differential circulator.

An example of a differential circulator is illustrated in a perspective view from the top in FIG. 7A and from the bottom in FIG. 7B, in a partial cross-sectional view in FIG. 8 (not all features illustrated), and in an exploded view in FIG. 9. The differential circulator includes six ports 205, three for a first, or upper three-port junction conductor 210A and three ports for a second, or lower three-port junction conductor 210B (also referred to as circuits 210A, 210B herein). The ports for each of the circuits 210A, 210B are offset by 120° from one another. The two circuits 210A, 210B may be arranged such that their respective ports 205 are rotated 60° from one another so that adjacent ports in the differential circulator are each separated by arcs of 60°, but this is not necessary in all embodiments. Providing for each port to be separated from an adjacent port by 60°, however, maximizes the distance between adjacent ports 205, which may facilitate making electrical connections to the ports. In the embodiment illustrated in FIGS. 7A, 7B, and 9, the differential circulator includes a frame 215 (labelled in FIG. 9) having conductive posts 220 that electrically couple to respective ports 205, that are secured within insulating blocks 225, that extend to a common plane below the bottom of the housing 230 of the circulator, and that provide for the differential circulator to be surface mounted.

With reference to FIGS. 8 and 9, from the top to the bottom, the differential circulator includes a cover 235, a cover return 240 (made of a magnetic material, similar to the housing, for example, cold rolled steel, to close the magnetic return path at the top of the housing), an upper magnet 245A, an upper pole piece 250A (made of a magnetic material, for example, cold rolled steel, used to 'straighten up' the magnetic field provided by the magnets in the z-direction and provide uniformity in the field applied through the ferrite material), an upper ferrite disc 255A disposed within an upper dielectric ring 260A, together indicated as upper ferrite assembly 265A in FIG. 9, upper circuit 210A, an upper dielectric spacer 270A, a ground plane 275, a lower dielectric spacer 270B, a lower ferrite assembly 265B including a lower ferrite disc 255B disposed within a lower dielectric ring, together indicated as lower ferrite assembly 265B in FIG. 9, a lower pole piece 250B, and a lower magnet 245B. Suitable ferrite materials that may be utilized in the upper and lower ferrite discs of embodiments disclosed herein include synthetic garnets, such as those disclosed in U.S. Pat. No. 10,773,972, incorporated herein by reference. Suitable ferrite materials are available from Skyworks Solutions, Inc.

The overall package for a junction circulator may range from 5-25 mm in diameter and 5-15 mm in height. In the x-y plane the size is dictated by the frequency of operation and performance requirements, the height is dictated by the magnetic bias field required to make the device operate according to given specifications.

The diameter of the internal components will typically be the outer diameter minus the housing thickness minus the desired mechanical clearance.

Component thicknesses may be within the ranges that follow:

Ferrite assembly=0.5-1.5 mm
Circuit (Copper)=0.1-0.25 mm
Ground plane (Copper)=0.1-0.25 mm
Dielectric spacer=TBD (Still in development)
Pole piece (Steel)=0.1-0.25 mm
Cover return (Steel)=0.1-1 mm
Magnet=Remainder (Although this may be reduced if introducing temperature compensation)

The magnet material may be either a hard ferrite (e.g., barium or strontium ferrite) or rare earth (e.g., samarium cobalt).

Figure 10:
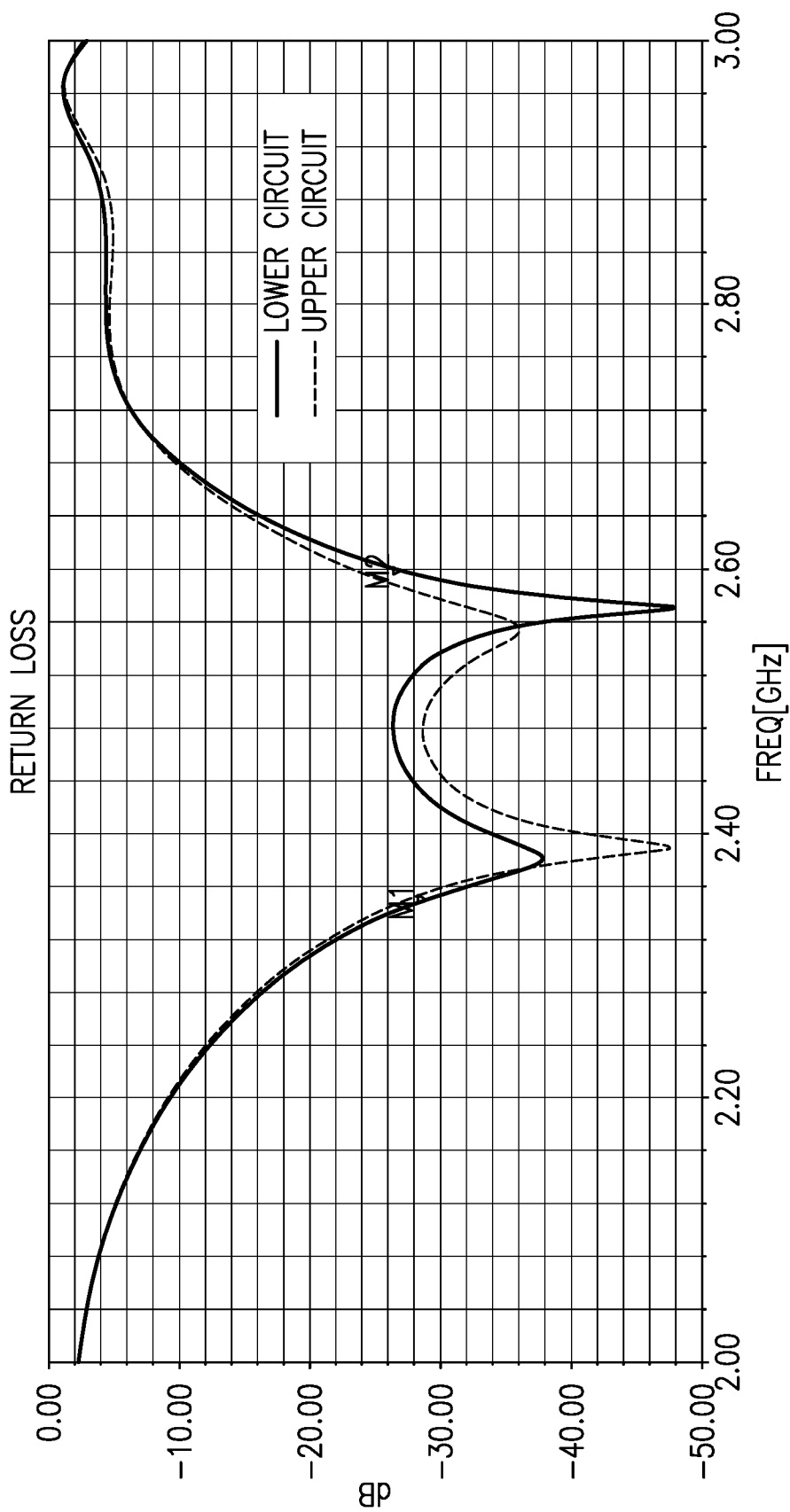
FIG. 10 is a chart of results of a simulation of return loss for an example of a differential circulator.

Simulations were performed to evaluate the performance characteristics of a differential circulator as disclosed herein and to determine how well the performance of the upper and lower circuits matched one another. The simulated differential circulator had an operating frequency range of between 2.35 GHz and 2.6 GHz. In the simulated circulator, the ferrite material was Skyworks® TTVG-1600 and had a diameter of 15 mm and a thickness of 0.6 mm, the dielectric ring material was Skyworks® MCT-20 and had a diameter of 17 mm and a thickness of 0.6 mm, and the dielectric spacer material was alumina with a diameter of 17 mm and thickness of 0.6 mm. FIG. 10 illustrates results of a simulation of Return Loss of the upper and lower circuits in the simulated circulator. Both the upper and lower circuits exhibited a return loss of less than about −24 dB throughout the operating frequency range. This return loss is considered negligible and indicates that the upper and lower circuits are well matched with respect to return loss throughout the operating frequency range.

Figure 11:
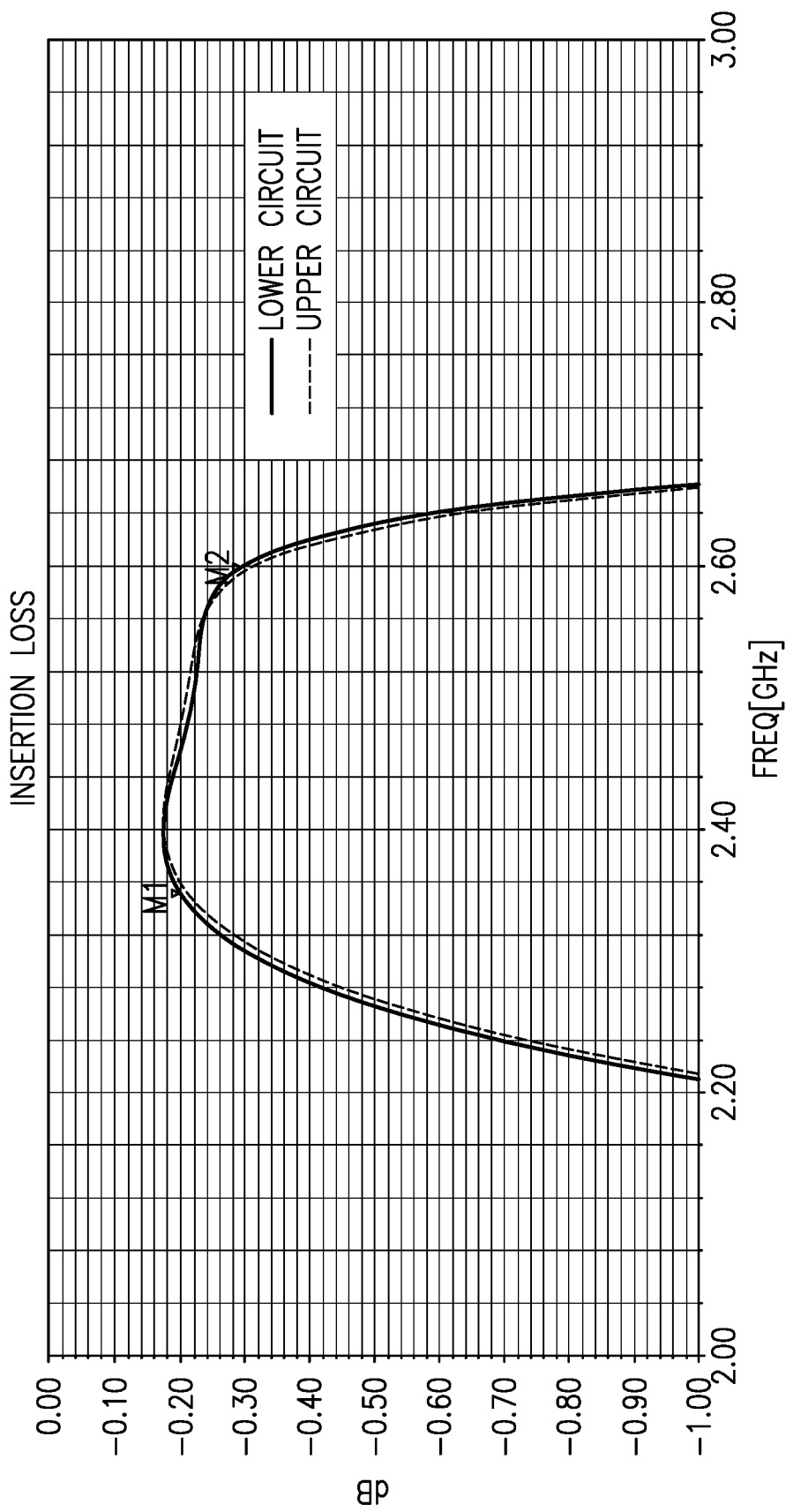
FIG. 11 is a chart of results of a simulation of insertion loss for an example of a differential circulator.

FIG. 11 illustrates results of a simulation of insertion loss for the upper and lower circuits of the simulated circulator. The insertion loss exhibited by the two circuits was well matched throughout the operating frequency range.

Figure 12:
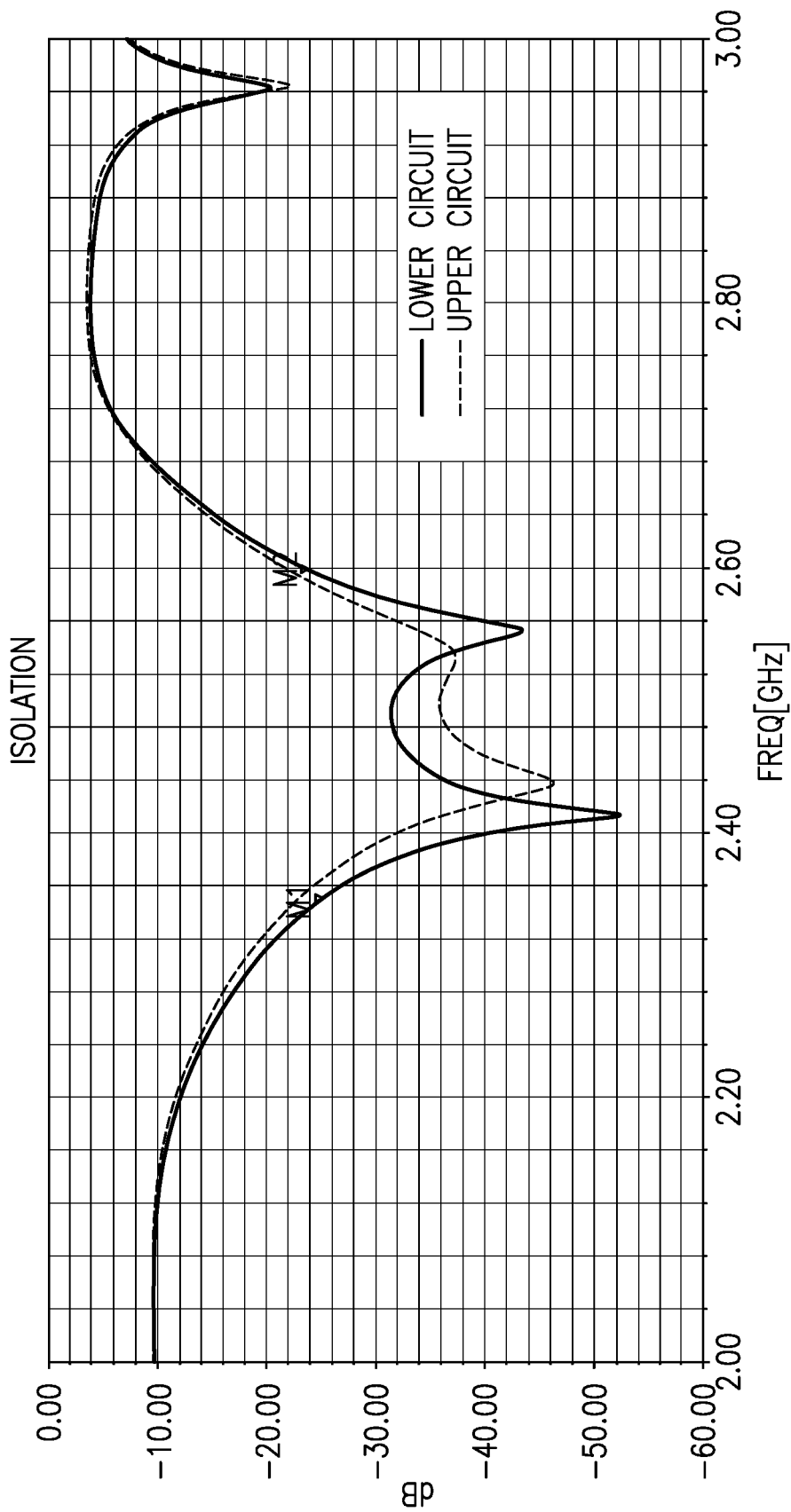
FIG. 12 is a chart of results of a simulation of isolation for an example of a differential circulator.

FIG. 12 illustrates results of a simulation of isolation between isolated ports for the upper and lower circuits of the simulated circulator. The levels of isolation exhibited by the two circuits was below −20 dB for each of the circuits, which is considered insignificant and indicates that the two circuits were well matched with respect to isolation throughout the operating frequency range.

Figure 13:
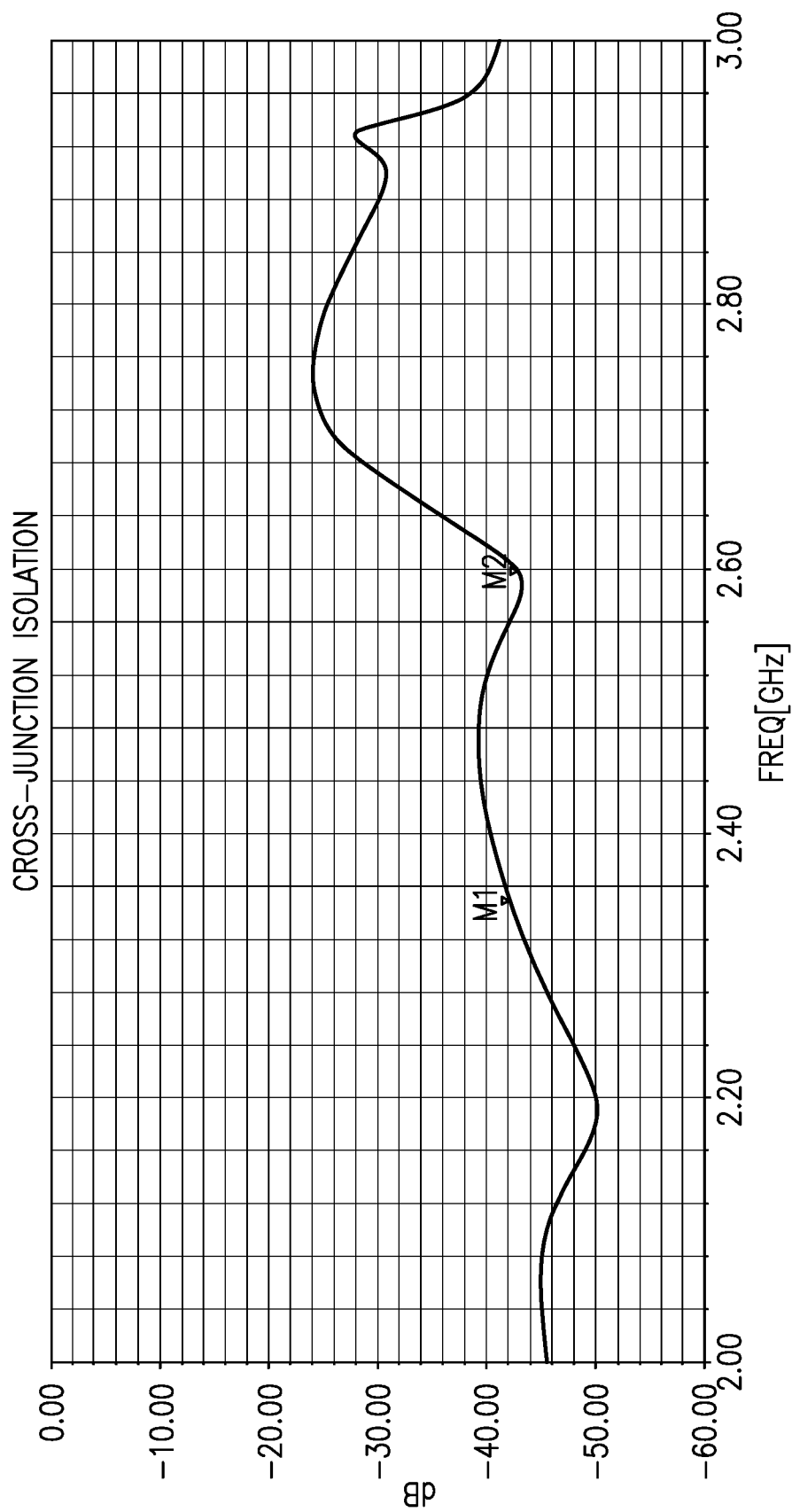
FIG. 13 is a chart of results of a simulation of cross-junction isolation for an example of a differential circulator.

FIG. 13 illustrates results of a simulation of cross-junction isolation between the upper and lower circuits of the simulated circulator. The levels of cross-junction isolation exhibited by the two circuits was below about −38 dB across the operating frequency range, which is considered insignificant.

Embodiments of the disclosed differential circulators/isolators can be particularly advantageous for 5th generation wireless system (5G) applications, though could also be used for early 4G and 3G applications as well.

The teachings herein are applicable to a wide variety of communication systems, including, but not limited to, communication systems using advanced cellular technologies, such as LTE-Advanced, LTE-Advanced Pro, and/or 5G NR.

Figure 14:
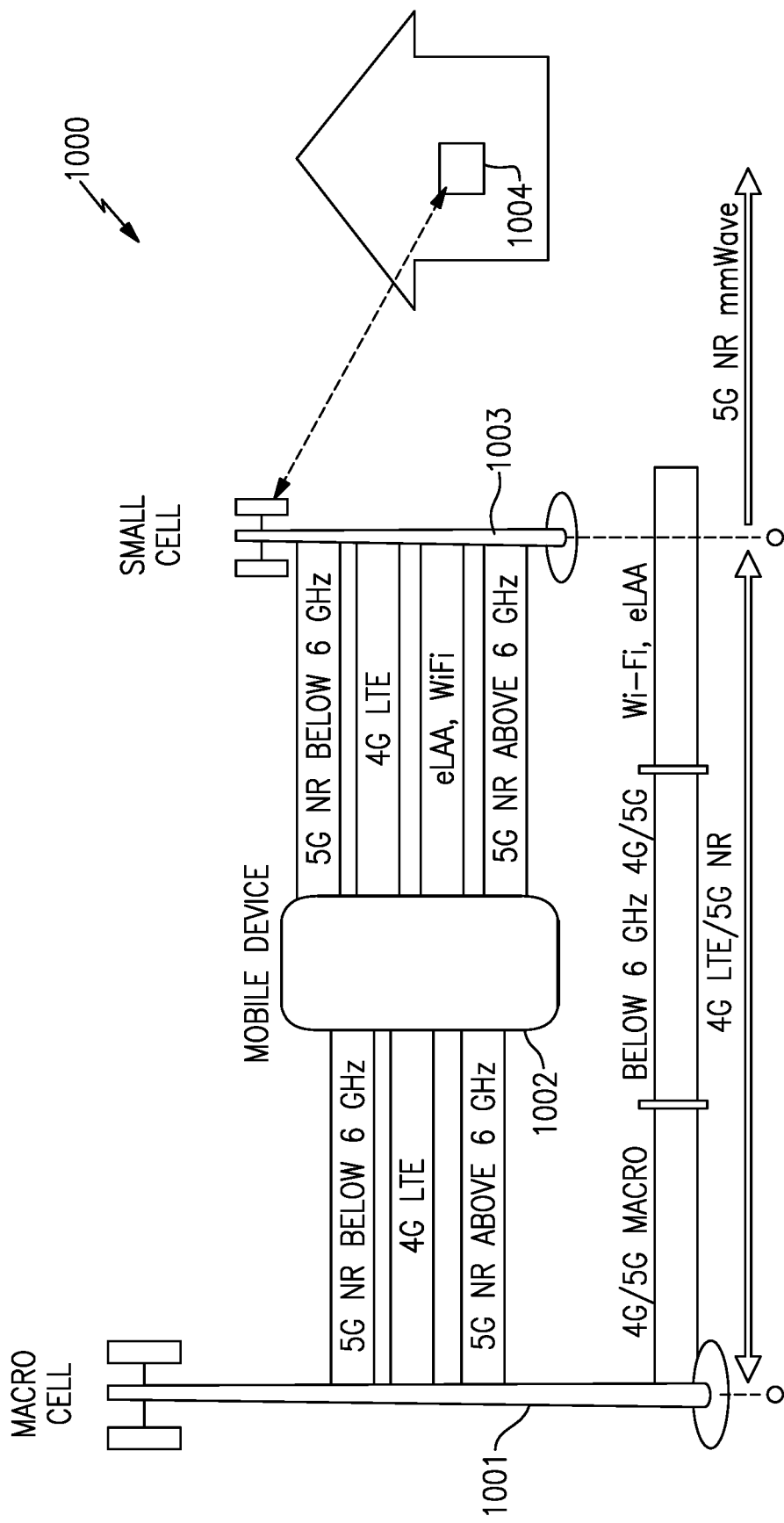
FIG. 14 is a schematic diagram of one example of a communication network.

FIG. 14 is a schematic diagram of one example of a communication network 1000. The communication network 1000 includes a macro cell base station 1001, a mobile device 1002, a small cell base station 1003, and a stationary wireless device 1004.

The illustrated communication network 1000 of FIG. 14 supports communications using a variety of technologies, including, for example, 4G LTE, 5G NR, and wireless local area network (WLAN), such as Wi-Fi. Although various examples of supported communication technologies are shown, the communication network 1000 can be adapted to support a wide variety of communication technologies.

Various communication links of the communication network 1000 have been depicted in FIG. 14. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 14, the mobile device 1002 communicates with the macro cell base station 1001 over a communication link that uses a combination of 4G LTE and 5G NR technologies. The mobile device 1002 also communicates with the small cell base station 1003 which can include embodiments of the disclosure. In the illustrated example, the mobile device 1002 and small cell base station 1003 communicate over a communication link that uses 5G NR, 4G LTE, and Wi-Fi technologies.

In certain implementations, the mobile device 1002 communicates with the macro cell base station 1001 and the small cell base station 1003 using 5G NR technology over one or more frequency bands that are less than 6 Gigahertz (GHz). In one embodiment, the mobile device 1002 supports a HPUE power class specification.

The illustrated small cell base station 1003, incorporating embodiments of the disclosure, also communicates with a stationary wireless device 1004. The small cell base station 1003 can be used, for example, to provide broadband service using 5G NR technology over one or more frequency bands above 6 GHz, including, for example, millimeter wave bands in the frequency range of 30 GHz to 300 GHz.

In certain implementations, the small cell base station 1003 communicates with the stationary wireless device 1004 using beamforming. For example, beamforming can be used to focus signal strength to overcome path losses, such as high loss associated with communicating over millimeter wave frequencies.

The communication network 1000 of FIG. 14 includes the macro cell base station 1001, which can include embodiments of the disclosure (such as examples of the disclosed differential circulators/isolators), and the small cell base station 1003. In certain implementations, the small cell base station 1003 can operate with relatively lower power, shorter range, and/or with fewer concurrent users relative to the macro cell base station 1001. The small cell base station 1003 can also be referred to as a femtocell, a picocell, or a microcell.

Although the communication network 1000 is illustrated as including two base stations, the communication network 1000 can be implemented to include more or fewer base stations and/or base stations of other types.

The communication network 1000 of FIG. 14 is illustrated as including one mobile device and one stationary wireless device. The mobile device 1002 and the stationary wireless device 1004 illustrate two examples of user devices or user equipment (UE). Although the communication network 1000 is illustrated as including two user devices, the communication network 1000 can be used to communicate with more or fewer user devices and/or user devices of other types. For example, user devices can include mobile phones, tablets, laptops, IoT devices, wearable electronics, and/or a wide variety of other communications devices.

User devices of the communication network 1000 can share available network resources (for instance, available frequency spectrum) in a wide variety of ways.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 ms. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 1000 of FIG. 14 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Figure 15:
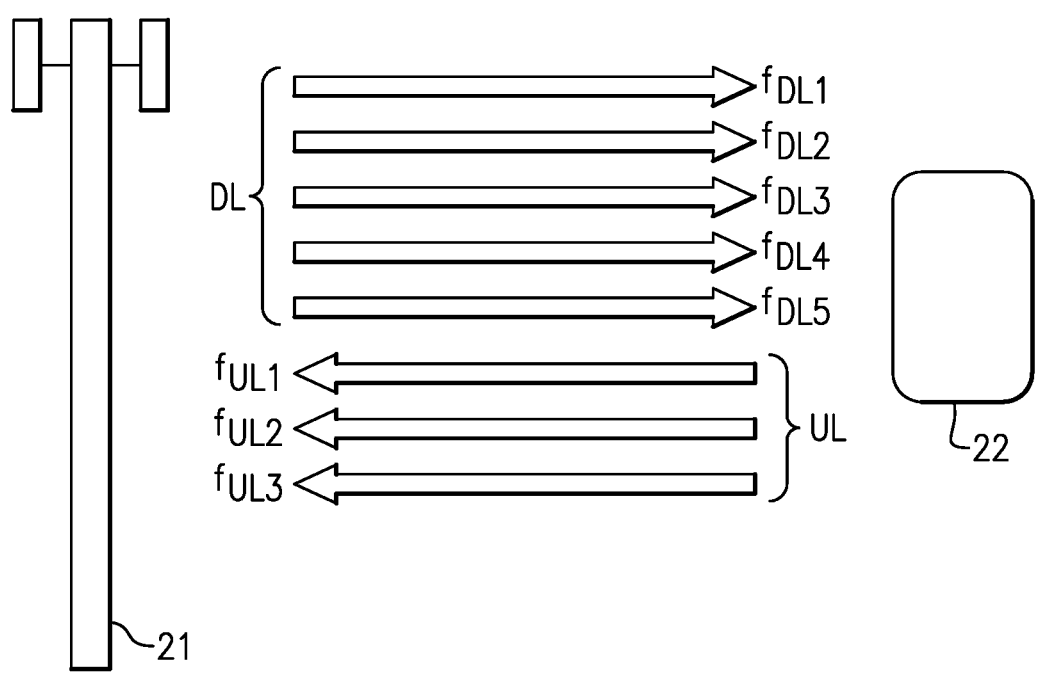
FIG. 15 is a schematic diagram of one example of a communication link using carrier aggregation.

FIG. 15 is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 15 the communications link includes a downlink channel used for RF communications from the base station 21 to the mobile device 22, and an uplink channel used for RF communications from the mobile device 22 to the base station 21.

Although FIG. 15 illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 15, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

With reference to FIG. 15, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Figure 16A:
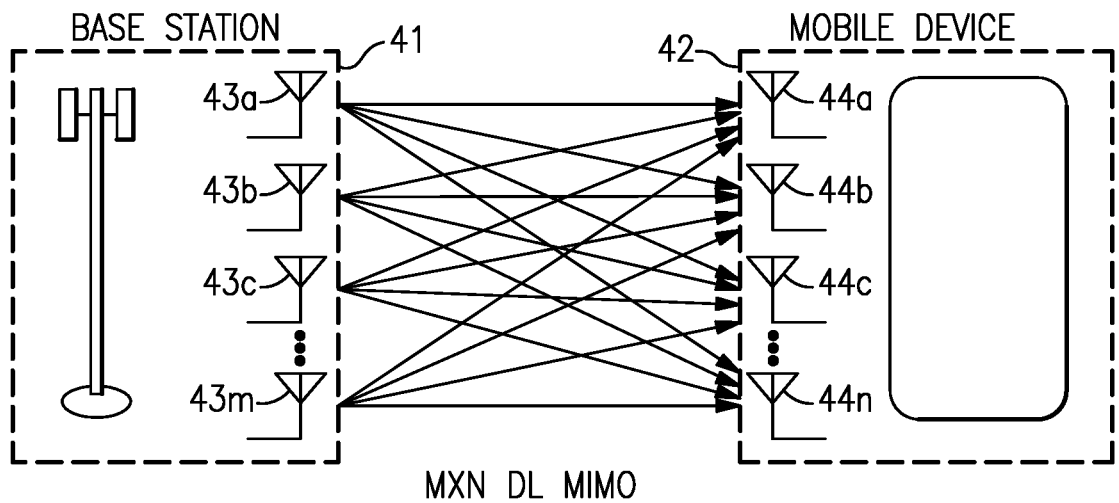
FIG. 16A is a schematic diagram of one example of a downlink channel using multi-input and multi-output (MIMO) communications.
Figure 16B:
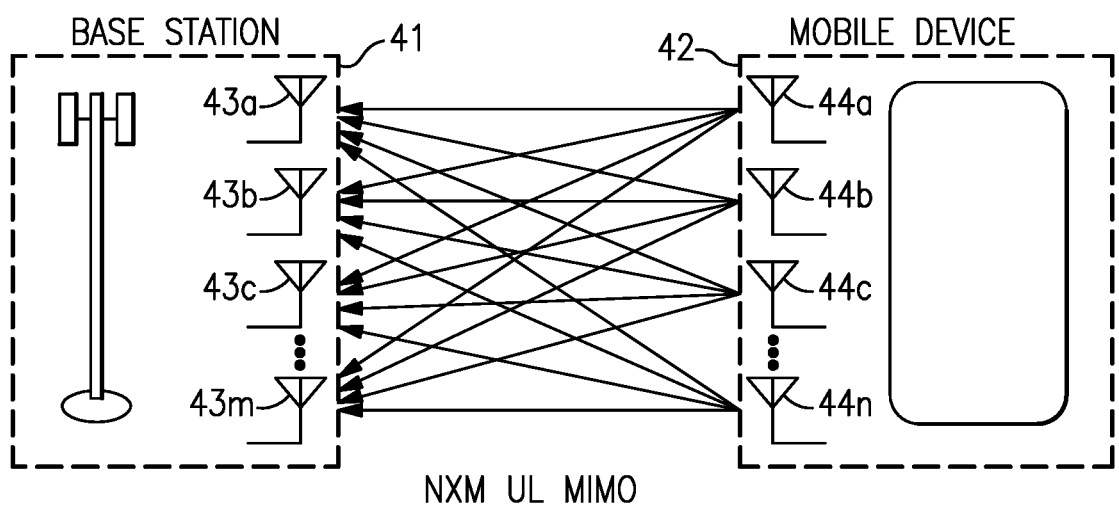
FIG. 16B is schematic diagram of one example of an uplink channel using MIMO communications.

FIG. 16A is a schematic diagram of one example of a downlink channel using multi-input and multi-output (MIMO) communications. FIG. 16B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 16A, downlink MIMO communications are provided by transmitting using M antennas 43*a*, 43*b*, 43*c*, . . . 43*m* of the base station 41 and receiving using N antennas 44*a*, 44*b*, 44*c*, . . . 44*n* of the mobile device 42. Accordingly, FIG. 16A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 16B, uplink MIMO communications are provided by transmitting using N antennas 44*a*, 44*b*, 44*c*, . . . 44*n* of the mobile device 42 and receiving using M antennas 43*a*, 43*b*, 43*c*, . . . 43*m* of the base station 41. Accordingly, FIG. 16B illustrates an example of N×M UL MIMO.

By increasing the level or order of MIMO, bandwidth of an uplink channel and/or a downlink channel can be increased.

Although illustrated in the context of FDD, MIMO communications are also applicable communication links using TDD.

For these 5G networks, one form of base station will be massive multiple input, multiple output (MIMO) based, with an array of perhaps 64-128 antennas capable of multi-beam forming to interact with handheld terminals at very high data rates. Thus, embodiments of the disclosure can be incorporated into the base stations to provide for high capacity applications.

This approach is similar to radar phased array T/R modules, with individual transceivers for each antenna element, although massive MIMO is not a phased array in the radar sense. The objective is optimum coherent signal strength at the terminal(s) rather than direction finding. Further, signal separation will be time division (TD) based, requiring a means of duplexing/switching to separate Tx and Rx signals For discussion, it is assumed that there is one Tx, one Rx module, one duplexing circulator and one antenna filter per antenna. However, other configurations can be used as well.

FIG. 14 shows a simplified version of an RF transmission system, omitting drivers and switching logic. As shown, the system can include a number of different components, including examples of differential circulators/isolators as disclosed herein. Thus, embodiments of the disclosure can be used as the differential circulators/isolators in the RF system, either for newly created systems or as improved replacements for the previous systems.

Figure 17:
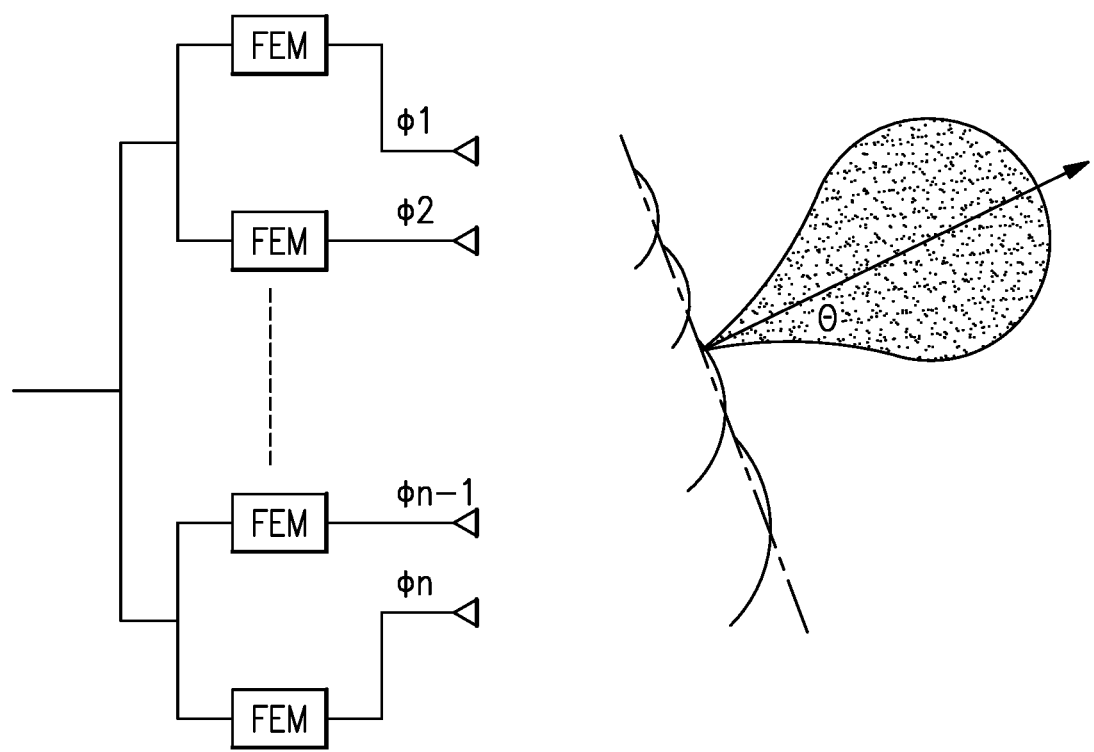
FIG. 17 illustrates a MIMO system incorporating embodiments of the disclosure.

FIG. 17 illustrates another embodiment of a MIMO system in which the disclosed differential circulators/isolators can be incorporated. With the advent of massive MIMO for 5G system the current antennas will be replaced with antenna arrays with, for example, 64 array elements. Each element can be fed by a separate front end module (FEM) including the features shown in FIG. 6 in which embodiments of the differential circulator can be an integral component.

Figure 18:
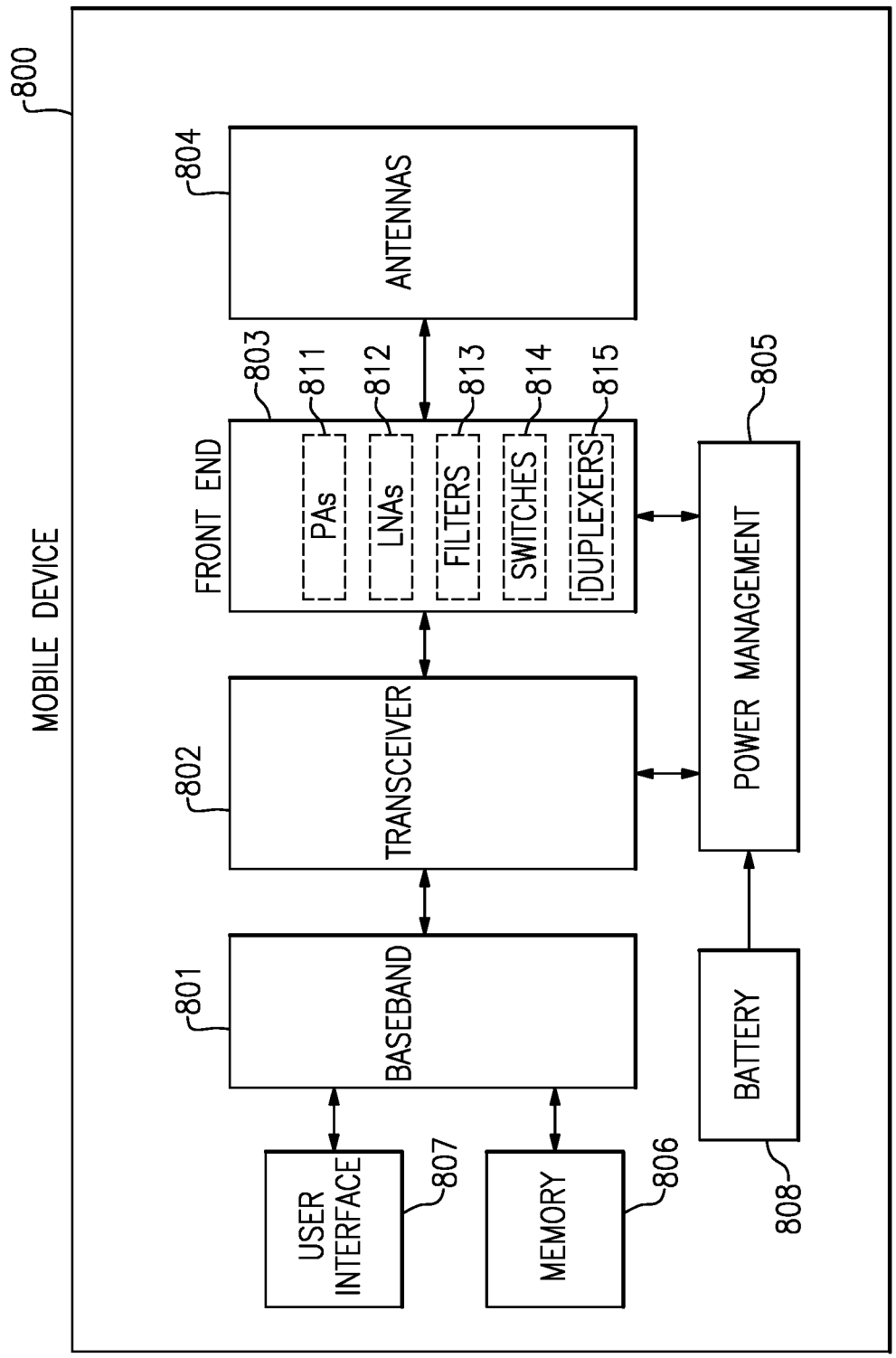
FIG. 18 is a schematic diagram of one example of a mobile device.

FIG. 18 is a schematic diagram of one example of a mobile device 800. The mobile device 800 includes a baseband system 801, a transceiver 802, a front end system 803, antennas 804, a power management system 805, a memory 806, a user interface 807, and a battery 808 and can interact with the base stations including embodiments of the differential circulators disclosed herein.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 18 as the transceiver 802. In one example, separate components (for instance, separate circuits or dies) can be provided for handling certain types of RF signals.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

From the foregoing description, it will be appreciated that inventive products and approaches for differential circulators/isolators are disclosed. While several components, techniques and aspects have been described with a certain degree of particularity, it is manifest that many changes can be made in the specific designs, constructions and methodology herein above described without departing from the spirit and scope of this disclosure.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount. If the stated amount is 0 (e.g., none, having no), the above recited ranges can be specific ranges, and not within a particular % of the value. For example, within less than or equal to 10 wt./vol. % of, within less than or equal to 5 wt./vol. % of, within less than or equal to 1 wt./vol. % of, within less than or equal to 0.1 wt./vol. % of, and within less than or equal to 0.01 wt./vol. % of the stated amount.

Some embodiments have been described in connection with the accompanying drawings. The figures are drawn to scale, but such scale should not be limiting, since dimensions and proportions other than what are shown are contemplated and are within the scope of the disclosed inventions. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

While a number of embodiments and variations thereof have been described in detail, other modifications and methods of using the same will be apparent to those of skill in the art. Accordingly, it should be understood that various applications, modifications, materials, and substitutions can be made of equivalents without departing from the unique and inventive disclosure herein or the scope of the claims.

What is claimed is:

1. A differential circulator comprising:
   first and second magnets;
   a ground plane;
   a first three-port junction conductor disposed between the first magnet and the ground plane; and
   a second three-port junction conductor disposed between the second magnet and the ground plane, the first three-port junction conductor and the second three-port junction conductor being in a same magnetic circuit including the first and second magnets to provide substantially same pass characteristics to radio frequency signals passing through the first three-port junction conductor and the second three-port junction conductor.

2. The differential circulator of claim 1 wherein the first three-port junction conductor is formed of a same material as the second three-port junction conductor.

3. The differential circulator of claim 2 wherein the first three-port junction conductor has same dimensions as the second three-port junction conductor.

4. The differential circulator of claim 1 further comprising a first dielectric spacer disposed between the first three-port junction conductor and the ground plane.

5. The differential circulator of claim 4 further comprising a second dielectric spacer disposed between the second three-port junction conductor and the ground plane.

6. The differential circulator of claim 1 further including a housing in which the first and second magnets, the ground plane, and the first and second three-port junction conductors are disposed and a frame disposed in the housing, the frame supporting conductive posts electrically coupled to ports of each of the first and second three-port junction conductors.

7. The differential circulator of claim 6 wherein the frame includes insulating blocks in which the conductive posts are secured.

8. The differential circulator of claim 6 wherein the conductive posts extend to and terminate at a plane below a bottom of the housing.

9. The differential circulator of claim 8 configured as a surface mount component.

10. The differential circulator of claim 1 wherein the first three-port junction conductor and the second three-port junction conductor are substantially matched with respect to return loss within an operating frequency band.

11. The differential circulator of claim 1 wherein the first three-port junction conductor and the second three-port junction conductor are substantially matched with respect to insertion loss within an operating frequency band.

12. The differential circulator of claim 1 wherein the first three-port junction conductor and the second three-port junction conductor are substantially matched with respect to isolation within an operating frequency band.

13. The differential circulator of claim 1 exhibiting a cross-junction isolation of better than −35 dB within an operating frequency band.

14. The differential circulator of claim 1 wherein the first three-port junction conductor and the second three-port junction conductor are substantially matched with respect to insertion phase within an operating frequency band.

15. A differential transceiver comprising:
   a differential transmission circuit;
   a differential power amplifier in first and second signal paths from the differential transmission circuit;
   first and second dipole antennas; and
   a differential circulator including a first three-port junction conductor in the first signal path between the differential power amplifier and a pole of the first dipole antenna and a second three-port junction conductor in the second signal path between the differential power amplifier and a pole of the second dipole antenna.

16. The differential transceiver of claim 15 wherein the differential circulator includes first and second magnets and the first three-port junction conductor and the second three-port junction conductor are in a same magnetic circuit including the first and second magnets.

17. The differential transceiver of claim 15 further comprising a differential receive circuit, wherein the first three-port junction conductor of the differential circulator is in a third signal path between the pole of the first dipole antenna and the differential receive circuit and the second three-port junction conductor of the differential circulator is in a fourth signal path between the pole of the second dipole antenna and the differential receive circuit.

18. The differential transceiver of claim 17 further comprising a differential low noise amplifier in the third and fourth signal paths between the first and second three-port junction conductors of the differential circulator and the differential receive circuit.

19. A radio frequency module including the differential transceiver of claim 15.

20. A radio frequency device including the radio frequency module of claim 19.

21. The radio frequency device of claim 20 configured to operate as a 5G system.

* * * * *